US008576022B2

(12) United States Patent
Chikando et al.

(10) Patent No.: US 8,576,022 B2
(45) Date of Patent: Nov. 5, 2013

(54) TUNING A PROGRAMMABLE POWER LINE FILTER

(75) Inventors: Eric N. Chikando, Raleigh, NC (US); Brad E. Dillon, Raleigh, NC (US); Tuan D. Ngo, Raleigh, NC (US); William J. Roberts, Raleigh, NC (US); Eric R. Schumann, Raleigh, NC (US); Ronald L. Underwood, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 1007 days.

(21) Appl. No.: 12/629,109

(22) Filed: Dec. 2, 2009

(65) Prior Publication Data

US 2011/0128087 A1    Jun. 2, 2011

(51) Int. Cl.
*H03G 11/04*    (2006.01)
*H04B 3/04*    (2006.01)

(52) U.S. Cl.
USPC ............................ 333/17.1; 333/174; 333/181

(58) Field of Classification Search
USPC ............................ 333/17.1, 174, 181; 361/118
See application file for complete search history.

(56) References Cited

U.S. PATENT DOCUMENTS

| 4,544,899 | A | 10/1985 | Townsend et al. |
| 5,179,362 | A | 1/1993 | Okochi et al. |
| 5,552,976 | A | 9/1996 | Munro et al. |
| 6,898,092 | B2 | 5/2005 | Briere et al. |
| 7,049,902 | B2 * | 5/2006 | Myong et al. ............... 333/17.1 |
| 7,577,002 | B2 | 8/2009 | Yang |
| 7,599,196 | B2 * | 10/2009 | Alexander ..................... 363/13 |
| 2004/0008527 | A1 | 1/2004 | Honda |
| 2007/0252664 | A1 | 11/2007 | Saitoh et al. |
| 2007/0296277 | A1 | 12/2007 | Lee et al. |
| 2008/0246459 | A1 | 10/2008 | Ingman |

FOREIGN PATENT DOCUMENTS

| AT | 505460 A1 | 1/2009 |
| JP | 10294633 A | 11/1998 |
| JP | 2000323951 A | 11/2000 |
| JP | 2005184075 A | 7/2005 |

OTHER PUBLICATIONS

PCT Search Report and Written Opinion, Apr. 14, 2011; PCT Application No. PCT/EP2010/066222.

(Continued)

*Primary Examiner* — Robert Pascal
*Assistant Examiner* — Kimberly Glenn
(74) *Attorney, Agent, or Firm* — Brandon C. Kennedy; Cynthia G. Seal; Biggers & Ohanian, LLP

(57) ABSTRACT

Tuning a programmable power line filter, the power line filter including a live line, a neutral line, and a ground line connected to input terminals of the filter on an input side of the filter, the live line and the neutral line connected through inductors in the filter to output terminals on an output side of the filter, X-capacitors selectably connected through tuning switches between the live line and the neutral line, Y-capacitors selectably connected through tuning switches between the live line and ground and/or between the neutral line and ground, and a tuning control circuit connected to the tuning switches and selectably connected through one or more programming switches to the load, including measuring by the tuning control circuit the input impedance of the load and programming by the tuning control circuit the tuning switches in dependence upon the input impedance of the load.

20 Claims, 6 Drawing Sheets

(56) References Cited

OTHER PUBLICATIONS

Gunawan et al, "Radio-Frequency Common-Mode Noise Propagation Model for Power-Line Cable", IEEE Transactions on Power Delivery, Oct. 2005, pp. 2443-2449, vol. 20, No. 4, IEEE Service Center, New York, NY, USA.

Chang, et al; Computerized Conducted EMI Filter Design System Using LabVIEW and Its Application; 2001; pp. 185-194; vol. 25, No. 3; Natl. Sci. Counc.; Taipei, Taiwan.

* cited by examiner

TUNING A PROGRAMMABLE POWER LINE FILTER

BACKGROUND OF THE INVENTION

1. Field of the Invention

The field of the invention is data processing, or, more specifically, methods, apparatus, and products for tuning a programmable power line filter.

2. Description of Related Art

A challenge for marketability of information technology equipment is the difficulty of meeting safety and electromagnetic compatibility regulatory requirements as mandated by many worldwide governing regulatory bodies. One such requirement, and of particular interest in a power supply is its electromagnetic interference (EMI) profile. For this reason, power supply designs often incorporate at their front-end an EMI filter, which is referred to in this specification as a power line filter.

A very common load for a power line filter is a switching power supply. A switching power supply is generally small in size, of light weight, and operates at high efficiency. In view of these advantages, a switching power supply is often preferred for electronic devices. It is well known, however, that harmful high order harmonic noises are induced from a switching transistor, a rectifying diode, a transformer, a choke coil or the like in normal operation of a switching power supply, potentially causing interference either with operation of a device powered by the switching power supply or interfering with the operations of other nearby devices. Such noises include both differential mode noise which flows between power lines (i.e., between a live line and a neutral line) and common mode noise which flows between a power line and a ground line. Such current noises, connected without filtering directly to power mains, represent additional high frequency current drains out of the mains. These noise currents cause a voltage drop at the source impedance of the mains which can be measured at the mains terminals.

To attenuate both the differential mode noise and the common mode noise, a power line filter is imposed between the power mains and a load. Over time, however, due to normal wear and tear and also due to changes in load conditions imposed by usage, load impedance values can change, reflecting impedance mismatches back through the filter, changing the operating characteristics of the filter and decreasing filter performance. Current power line filter design topologies are such that any post-design adjustment of the filter transfer function and/or resonance requires a physical modification of its circuit components.

SUMMARY OF THE INVENTION

Methods, apparatus, and products are disclosed for tuning a programmable power line filter, the power line filter including a live line, a neutral line, and a ground line connected to input terminals of the filter on an input side of the filter, the live line and the neutral line connected through inductors in the filter to output terminals on an output side of the filter, X-capacitors selectably connected through tuning switches between the live line and the neutral line, Y-capacitors selectably connected through tuning switches between the live line and ground and/or between the neutral line and ground, and a tuning control circuit connected to the tuning switches and selectably connected through one or more programming switches to the load, including measuring by the tuning control circuit the input impedance of the load and programming by the tuning control circuit the tuning switches in dependence upon the input impedance of the load.

The foregoing and other objects, features and advantages of the invention will be apparent from the following more particular descriptions of example embodiments of the invention as illustrated in the accompanying drawings wherein like reference numbers generally represent like parts of example embodiments of the invention.

DETAILED DESCRIPTION OF EXAMPLE EMBODIMENTS

Figure 1:
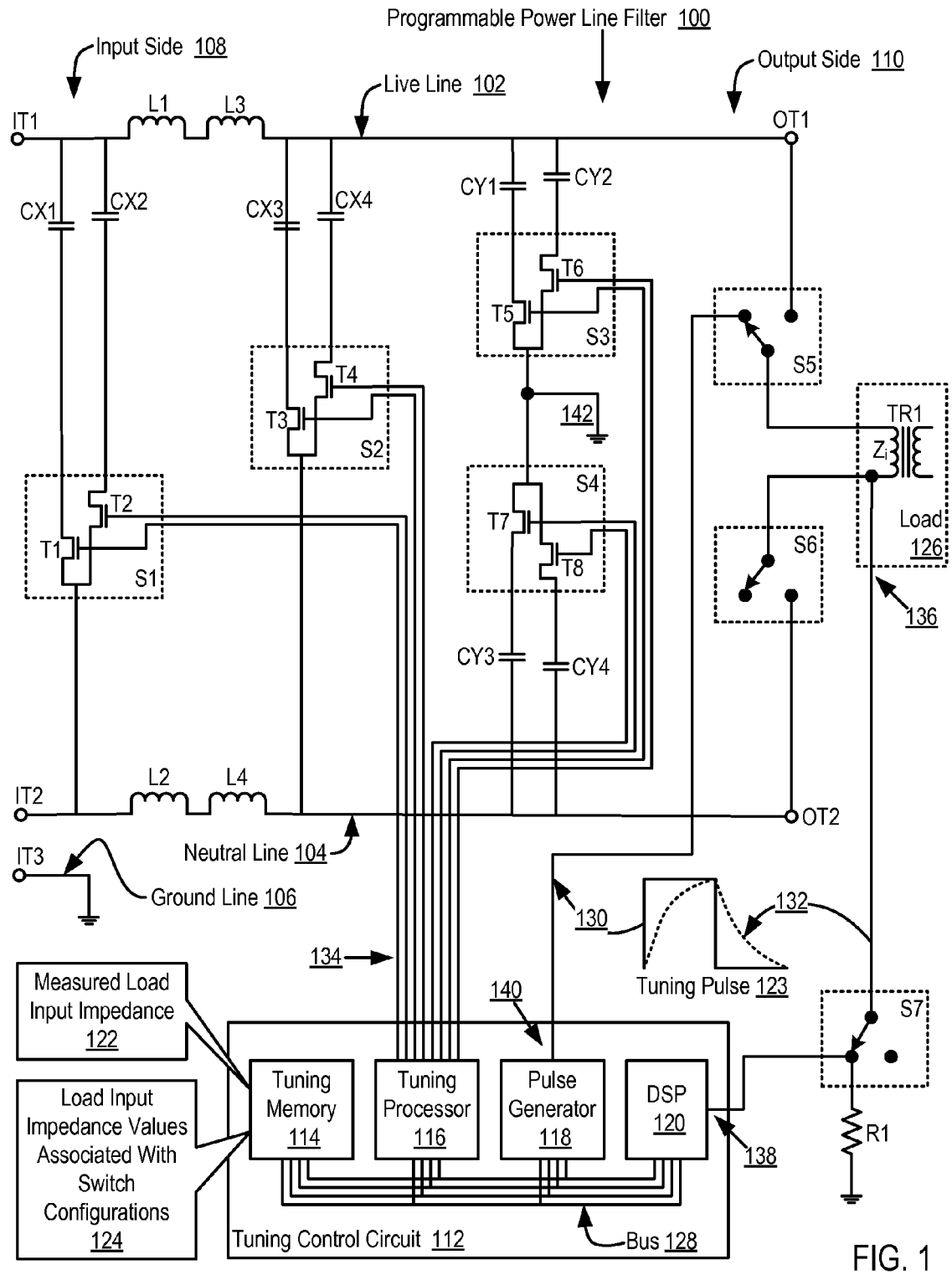
FIGS. 1-2 set forth schematic diagrams of an example programmable power line filter that is tunable according to embodiments of the present invention.

Example embodiments of a programmable power line filter, methods of tuning a programmable power line filter, and computer program products for tuning a programmable power line filter in accordance with the present invention are described with reference to the accompanying drawings, beginning with FIG. 1. FIG. 1 sets forth a schematic diagram of an example programmable power line filter (100) that is tunable according to embodiments of the present invention. Except for the load (126), all the items illustrated in FIG. 1 are components of the filter (100).

The filter (100) of FIG. 1 includes a live line (102), a neutral line (104), and a ground line (106) all of which are connected to input terminals (IT1, IT2, IT3) of the filter on an input side (108) of the filter. The live line (102) and the neutral line (104) are connected through inductors (L1, L2, L3, L4) in the filter to output terminals (OT1, OT2) on an output side (110) of the filter.

The example filter (100) of FIG. 1 includes two inductors (L1, L3) disposed in the live line (102) between input terminal (IT1) and output terminal (OT1). The filter also includes two inductors (L2, L4) disposed in the neutral line (104) between input terminal (IT2) and output terminal (OT2). The inductors (L1, L2, L3, L4) are filter chokes. L3 and L4 are current compensated chokes, wound so that no magnetic field is generated by the operating current (50- or 60 Hz)—so L3 and L4 act against common-mode noise—with no effect upon the overall operating current flowing through the filter. L1 and L2 are not current compensated—so that they act against differential mode noise.

The filter includes four X-capacitors, called 'X-capacitors' because they are connected 'across' between the live line (102) and the neutral line (104), they also act to suppress differential mode noise. Two of the X-capacitors (CX1, CX2) are selectably connected through a first tuning switch (S1) between the live line (102) and the neutral line (104) on the input side (108) of the inductors (L1, L2, L3, L4), and the other two X-capacitors (CX3, CX4) are selectably connected through a second tuning switch (S2) between the live line (102) and the neutral line (104) on the output side (110) of the inductors (L1, L2, L3, L4). Each of the switches (S1, S2) in this example is composed of two transistors, respectively (T1, T2) and (T3, T4), configured as electronic switches capable of selecting for connection either one or both of a pair of X-capacitors. Transistors (T1, T2) in switch S1 can connect across between the live line and the neutral line only capacitor CX1, only capacitor CX2, or both capacitors CX1 and CX2. Transistors (T3, T4) in switch S2 can connect across between the live line and the neutral line only capacitor CX3, only capacitor CX4, or both capacitors CX3 and CX4.

The filter also includes four line-bypass or 'Y-capacitors,' which also suppress common mode noise. Two of the Y-capacitors (CY1, CY2) are selectably connected through a third tuning switch (S3) between the live line (102) and ground (142) on the output side (110) of the inductors (L1, L2, L3, L4), and the other two Y-capacitors are selectably connected through a fourth tuning switch (S4) between the neutral line (104) and ground (142)—also on the output side (110) of the inductors (L1, L2, L3, L4). Each of the switches (S3, S4) in this example is composed of two transistors, respectively (T5, T6) and (T7, T8), configured as electronic switches capable of selecting for connection either one or both of a pair of Y-capacitors. Transistors (T5, T6) in switch S3 can connect between the live line (102) and ground (142) only capacitor CY1, only capacitor CY2, or both capacitors CY1 and CY2. Transistors (T7, T8) in switch S4 can connect between the neutral line (104) and ground (142) only capacitor CY3, only capacitor CY4, or both capacitors CY3 and CY4.

The example programmable power line filter (100) of FIG. 1 includes a tuning control circuit (112). The tuning control circuit is connected through tuning control bus (134) to the tuning switches (S1, S2, S3, S4) and selectably connected through one or more programming switches (S5, S6, S7) to the load (126). The tuning control circuit (112) is composed of synchronous and asynchronous logic circuitry configured to carry out overall control of the process of tuning a programmable power line filter. More particularly, the tuning control circuit (122) is configured to tune the filter by measuring the input impedance $Z_i$ of the load (126) and programming the tuning switches (S1, S2, S3, S4) in dependence upon the input impedance of the load. The tuning control circuit may be implemented as an application specific integrated circuit ('ASIC'), as programmable array logic ('PAL'), as a field programmable gate array ('FPGA'), as a complex programmable logic device ('CPLD'), as an embedded microcontroller with a control program stored in a Harvard architecture, as a microprocessor with a control program stored in non-volatile computer memory ('tuning memory'), and in other ways that may occur to those of skill in the art. To the extent that the tuning control circuit is implemented as PAL, ASIC, FPGA, CPLD, or the like, its functions can be specified in a hardware description language such as Verilog or in the very high speed integrated circuit design description language ('VHDL'). Such specifications of the tuning control circuit in hardware description languages may be embodied in computer program products—as can control programs for microcontrollers or microprocessors written in machine language, assembler, or in other programming languages as will occur to those of skill in the art.

In the example of FIG. 1, the filter's tuning control circuit (112) is configured with load input impedance values associated with switch configurations for the tuning switches (124). Configuring the tuning control circuit with load input impedance values associated with switch configurations for the tuning switches may be carried out during manufacture of the power line filter and left unchanged during the operational life of the power line filter. Alternatively, the configuration of the load input impedance values associated with switch configurations for the tuning switches can be updated by data input to the tuning control circuit periodically during the life of the power line filter so that, for example, the design parameters of the power line filter can be changed during the operational life of the filter. The tuning control circuit (112) can be configured with load input impedance values associated with switch configurations for the tuning switches (124) in the form illustrated, for example, by Table 1.

TABLE 1

Load Input Impedance Values
Associated With Switch Configurations

| Load Input Impedance Values | Switch Configurations |
|---|---|
| $Z_1$ | 10101010 |
| $Z_2$ | 01101010 |
| $Z_3$ | 11101010 |
| $Z_4$ | 10101010 |
| $Z_5$ | 10011010 |
| $Z_6$ | 10111010 |
| ... | ... |
| $Z_{81}$ | 11111111 |

Figure 2:
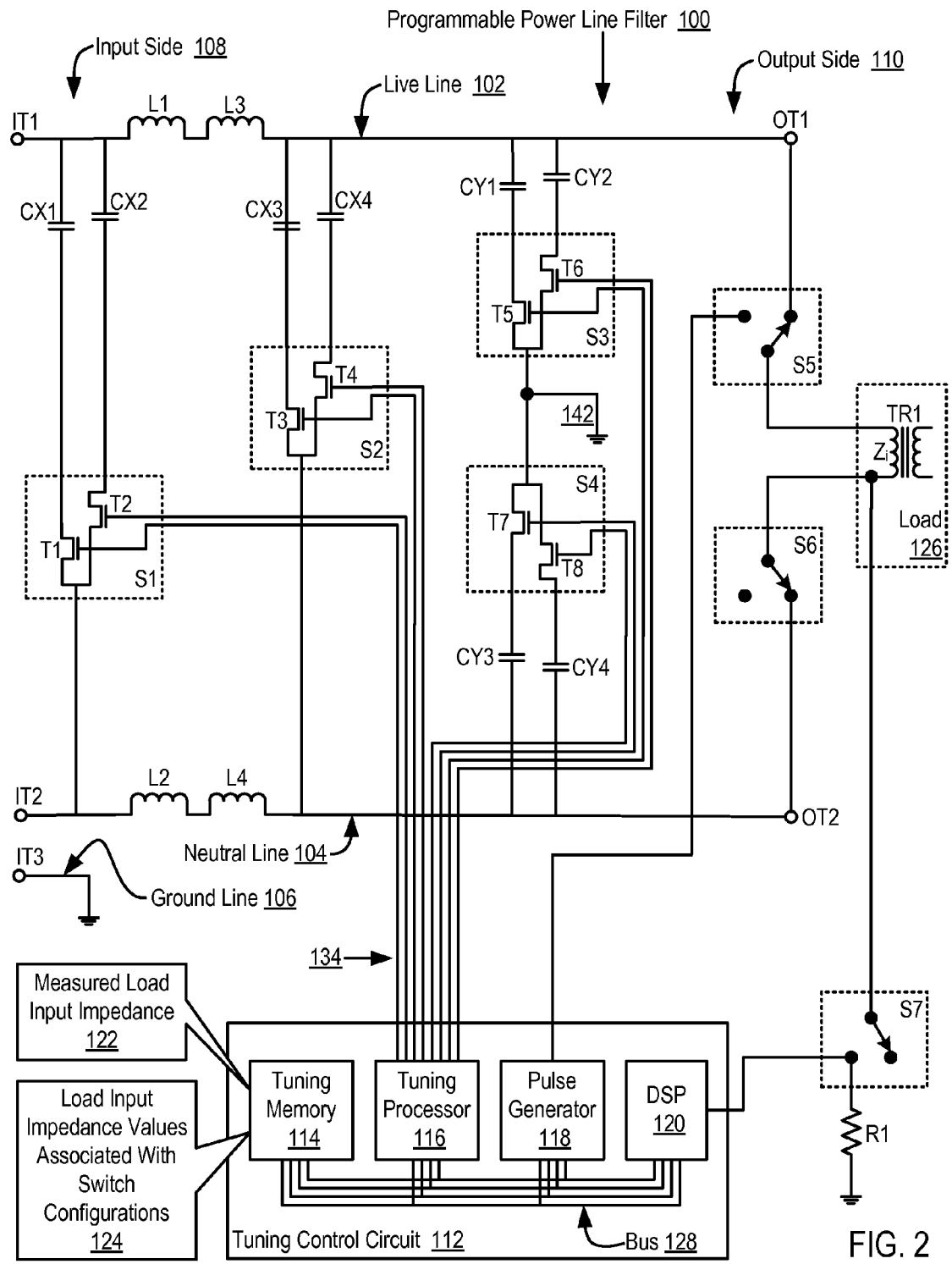

The use of a table to illustrate associations between load input impedance values and switch configurations for the tuning switches is only for convenience of explanation, not a limitation of the present invention. Associations between load input impedance values and switch configurations for the tuning switches can be implemented with linked lists, data arrays, and with other data structures as will occur to those of skill in the art. The impedance values in the left column of Table 1, $Z_1$, $Z_2$, $Z_3$, and so on, can be specified in polar form with a resultant value and an angle, as a combination of a real value and an imaginary component, and so on, as will occur to those of skill in the art. In the filter of FIG. 2, with four tuning switches (S1, S2, S3, S4) each of which can be placed into three useful states, there are $3^4=81$ useful switch configurations and therefore 81 different tunings of the programmable filter (100). Each record in Table 1 associates an input impedance value of the load (126) with a switch configuration. The tuning control circuit (112), having measured the actual input impedance $Z_i$ of the load (126), can then program the switches by selecting a switch configuration from Table 1 in dependence upon the switch configuration's associated load input impedance value and the measured input impedance of the load. That is, the tuning control circuit can look up in Table 1 a record whose load input impedance value $Z_1$, $Z_2$, $Z_3$, and so on, corresponds to the actual measured value of the input impedance $Z_i$ of the load and select the associated switch configuration.

The measured input impedance need not be exactly equal to any of the configured load input impedance values. The tuning control circuit can select a configured value closest to the measured value of the load input impedance. The tuning control circuit can then program the tuning switches (S1, S2, S3, S4) by setting the switches according to the selected switch configuration.

The switch configurations are represented here as 8-digit binary or logical values of the eight tuning lines that make up the tuning control bus (134), one digit for each line in the bus (134), with a '1' indicating that a corresponding tuning switch transistor is on and a '0' indicating that a corresponding tuning switch transistor is off, so that:

Switch configuration 10101010 indicates the tuning switches configured so that:
transistor T1 is on, transistor T2 is off,
transistor T3 is on, transistor T4 is off,
transistor T5 is on, transistor T6 is off,
transistor T7 is on, transistor T8 is off, Switch configuration 01101010 indicates the tuning switches configured so that:
transistor T1 is off, transistor T2 is on,
transistor T3 is on, transistor T4 is off, transistor T5 is on, transistor T6 is off,
transistor T7 is on, transistor T8 is off, Switch configuration 11101010 indicates the tuning switches configured so that:
transistor T1 is on, transistor T2 is on,
transistor T3 is on, transistor T4 is off,
transistor T5 is on, transistor T6 is off,
transistor T7 is on, transistor T8 is off, Switch configuration 10101010 indicates the tuning switches configured so that:
transistor T1 is on, transistor T2 is off,
transistor T3 is on, transistor T4 is off,
transistor T5 is on, transistor T6 is off,
transistor T7 is on, transistor T8 is off, Switch configuration 10011010 indicates the tuning switches configured so that:
transistor T1 is on, transistor T2 is off,
transistor T3 is off, transistor T4 is on,
transistor T5 is on, transistor T6 is off,
transistor T7 is on, transistor T8 is off, Switch configuration 10111010 indicates the tuning switches configured so that:
transistor T1 is on, transistor T2 is off,
transistor T3 is on, transistor T4 is on,
transistor T5 is on, transistor T6 is off,
transistor T7 is on, transistor T8 is off, and Switch configuration 11111111 indicates the tuning switches configured so that:
transistor T1 is on, transistor T2 is on,
transistor T3 is on, transistor T4 is on,
transistor T5 is on, transistor T6 is on,
transistor T7 is on, transistor T8 is on.

In the programmable power line filter (100) of FIG. 1, the tuning control circuit (112) includes a tuning processor (116) operably coupled through a data bus (128) to a pulse generator (116) and to a digital signal processor ('DSP') (120). The bus (128), referred to in this specification as a 'data bus,' carries both information among the components of the tuning control circuit as well as instructions from the tuning processor to other components. The tuning processor may be implemented in a number of ways, as a general purpose computer microprocessor, as an embedded microcontroller, and so on, as will occur to those of skill in the art. The pulse generator is a circuit module configured to emit, when instructed to do so, a single tuning pulse with predetermined pulse characteristics, voltage level, duration, and so on. The DSP is a kind of small computer in itself, with internal programming to sample input voltages, determine time rate of change of the sampled voltages, and use the time rate of change to calculate an input impedance value of the load. With this configuration, the tuning control circuit (112) can measure the input impedance of the load by connecting, under control of the tuning processor (116), an output (136) of the load (136) to an input (138) of the DSP (120).

In this example, the filter includes three programming switches (S5, S6, S7), with all three programming switch shown in the same state, with each of their switch poles thrown to a contact on the left, effectively configuring the filter to operate in a programming mode. The tuning control circuit can be configured to place the filter in this programming mode upon a manual instruction to do so, ever time the filter is powered on, periodically according to a predetermined schedule, and so on as may occur to those of skill in the art. In this state, the programming mode, switch S5 disconnects the live line (102) from the load (126) and connects the load to the output (140) of the pulse generator (118). Switch S6 disconnects the load from the neutral line (103). And switch S7 connects an output (136) of the load to a tuning resistor R1. The tuning processor (116) instructs the pulse generator (118) through bus (128) to drive a tuning pulse (130) from the pulse generator through the load (126). The tuning processor (116) also instructs the DSP (120) to sample the tuning pulse as voltage values (132) output from the load. The DSP uses the sampled voltage values (132) to derive the input impedance Z, of the load (126).

The tuning switch configuration implemented as logical or voltage values on the signal lines of the tuning control bus (134) can be latched into place so long as power is applied to the tuning control circuit (112). When power is cycled off and on again, however, the tuning control circuit loses state, requiring the switch configuration for the tuning switches (S1, S2, S3, S4) to be re-established. One way to do that is to configure the tuning control circuit (112) to re-measure the input impedance of the load and re-program the tuning switches every time power to the filter is cycled off and on.

Alternatively, there is at least one more way to re-establish a switch configuration for the tuning switches: In the programmable power line filter (100) of FIG. 1, the tuning control circuit (112) includes tuning memory (114) operably coupled through the data bus ( ) to the tuning processor (116), and all or at least part of the tuning memory (114) is non-volatile. After measuring the input impedance of the load as described above, the tuning processor (116) can store the measured input impedance (122) of the load (126) in a non-volatile portion of the tuning memory (114). Then later, when power to the filter (100) is cycled off and then on again, the tuning processor can use the stored input impedance (122) of the load to program the tuning switches with no need to re-measure the input impedance of the load. The tuning processor can, by use of the stored load input impedance (122), look up a switch configuration for the tuning switches among stored associations of load input impedance values and switch configurations for the tuning switches (124) in, for example, a data structure similar to Table 1, set the tuning switch transistors on and off according to the selected switch configuration, and latch the state of the tuning control bus (134)—all with no need to re-measure the actual input impedance of the load every time power to the filter is cycled off and on.

The arrangement of electronic components and other devices making up the example power line filter (100) illustrated in FIG. 1 are for explanation, not for limitation of the present invention. Power line filters capable of being tuned according to various embodiments of the present invention may include additional switches, transistors, diodes, capacitors, inductors, amplifiers, control circuitry, and other devices, not shown in FIG. 1, as will occur to those of skill in the art. Various embodiments of the present invention may be implemented in a variety of hardware configurations and with various forms of software in addition to those illustrated and described in the example of FIG. 1.

As mentioned, the programming switches (S5, S6, S7) in the example of FIG. 1, effectively configure the filter in a programming mode. For completeness of explanation, therefore, FIG. 2 sets forth a schematic diagram of a the example programmable power line filter (100) of FIG. 1 with its programming switches (S5, S6, S7) set to configure the filter in a normal operating mode. That is, the programming switches (S5, S6, S7) in the example of FIG. 2 are set to connect the live line (102) and the neutral line (104) to the load (126) and to disconnect the pulse generator (118) and the DSP (120) from the load. The tuning control circuit (128) has already tuned the filter by measuring the input impedance $Z_i$ of the load (126) and programming the tuning switches (S1, S2, S3, S4)

in dependence upon the input impedance of the load—so that the programmable power line filter (100) in this normal operating mode suppresses common mode noise and differential mode noise from the current supplied to the load (126) through the live line (102) and the neutral line (104).

Figure 3:
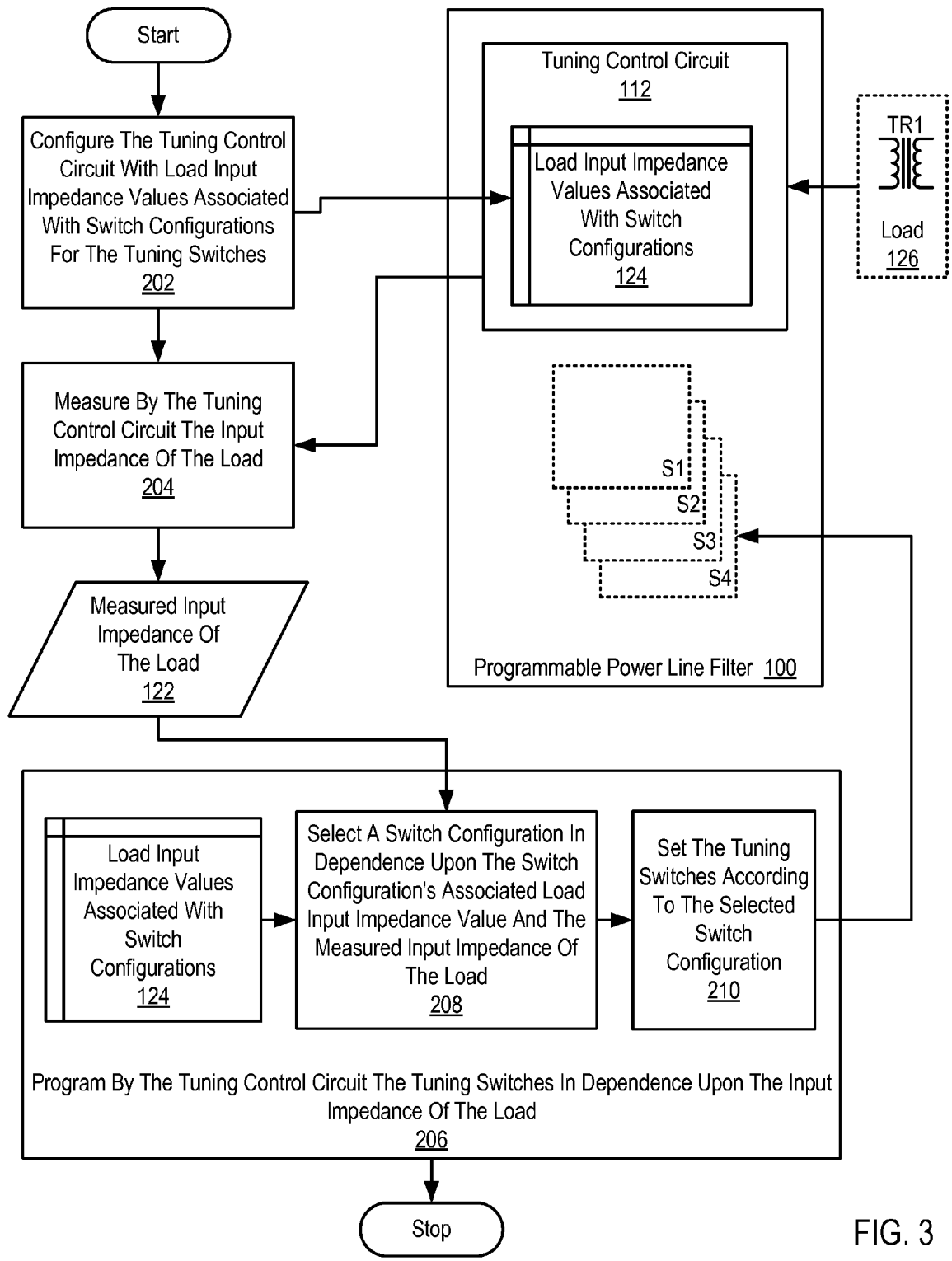
FIGS. 3-6 set forth flow charts illustrating example methods of tuning a programmable power line filter according to embodiments of the present invention.

For further explanation, FIG. 3 sets forth a flow chart illustrating an example method of tuning a programmable power line filter according to embodiments of the present invention. Tuning a programmable power line filter according to the method of FIG. 3 is carried out with a programmable power line filter like the one illustrated and described above with regard to FIG. 1—with a live line, a neutral line, a ground line, inductors, X-capacitors, Y-capacitors, tuning switches, programming switches, and a tuning control circuit—all disposed with respect to one another as shown and described above with reference to FIG. 1. The method of FIG. 3 therefore is described here with reference both to FIG. 3 and also to FIG. 1, using reference numbers from both figures.

The method of FIG. 3 includes configuring (202) the tuning control circuit (112) with load input impedance values associated with switch configurations for the tuning switches (124). Configuring (202) the tuning control circuit (112) with load input impedance values associated with switch configurations for the tuning switches (124) can be carried out as described above with regard to Table 1, using a table as such, a linked list, a two-dimensional array, or other similar data structures, and storing the associations hardwired, in non-volatile memory of the tuning control circuit, or the like. The method of FIG. 3 also includes measuring (204) by the tuning control circuit the input impedance (122) of the load (126), accomplished in this example by use of a tuning pulse and voltages sampled by a DSP from an output of the load. The method of FIG. 3 also includes programming (106) by the tuning control circuit the tuning switches (S1, S2, S3, S4) in dependence upon the input impedance (122) of the load. In the example of FIG. 3, programming (106) the tuning switches includes selecting (208) a switch configuration (e.g., from the right column of Table 1) in dependence upon the switch configuration's associated load input impedance value (left column of Table 1) and the measured input impedance (122) of the load and setting (210) the tuning switches according to the selected switch configuration.

Figure 4:
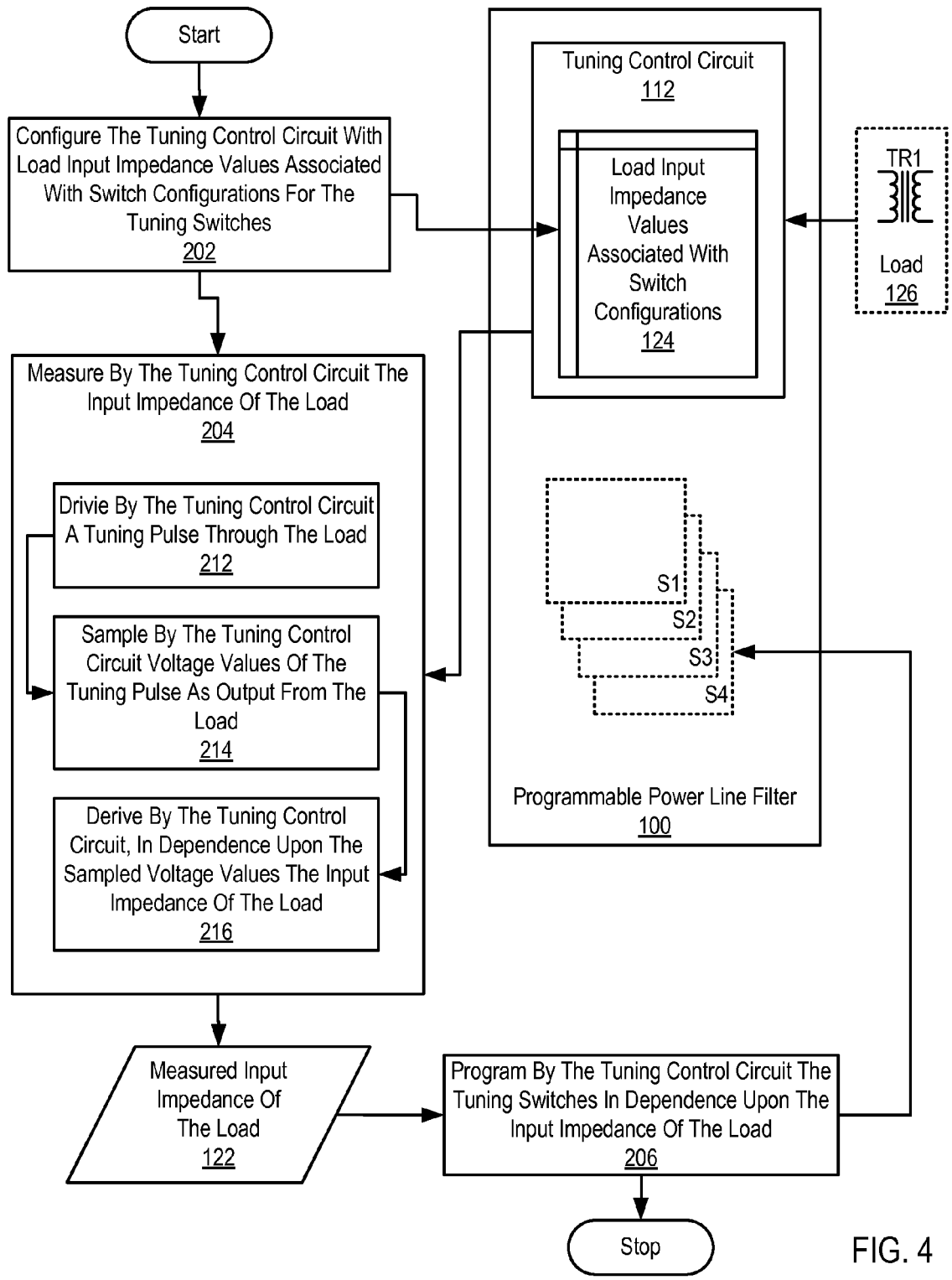

For further explanation, FIG. 4 sets forth a flow chart illustrating a further example method of tuning a programmable power line filter according to embodiments of the present invention. The method of FIG. 4 is similar to the method of FIG. 3 in that tuning a programmable power line filter according to the method of FIG. 4 is carried out with a programmable power line filter like the one illustrated and described above with regard to FIG. 1—with a live line, a neutral line, a ground line, inductors, X-capacitors, Y-capacitors, tuning switches, programming switches, and a tuning control circuit—all disposed with respect to one another as shown and described above with reference to FIG. 1. The method of FIG. 3 therefore is described here with reference both to FIG. 3 and also to FIG. 1, using reference numbers from both figures. The method of FIG. 4 is further similar to the method of FIG. 3 in that method of FIG. 4 includes configuring (202) the tuning control circuit (112) with load input impedance values associated with switch configurations for the tuning switches (124), measuring (204) by the tuning control circuit the input impedance (122) of the load (126), and programming (106) by the tuning control circuit the tuning switches (S1, S2, S3, S4) in dependence upon the input impedance (122) of the load. In the method of FIG. 4, however, measuring (204) the input impedance of the load includes driving (212) by the tuning control circuit a tuning pulse (123) through the load, sampling (214) by the tuning control circuit voltage values of the tuning pulse as output from the load, and deriving (216) by the tuning control circuit, in dependence upon the sampled voltage values the input impedance of the load.

Figure 5:
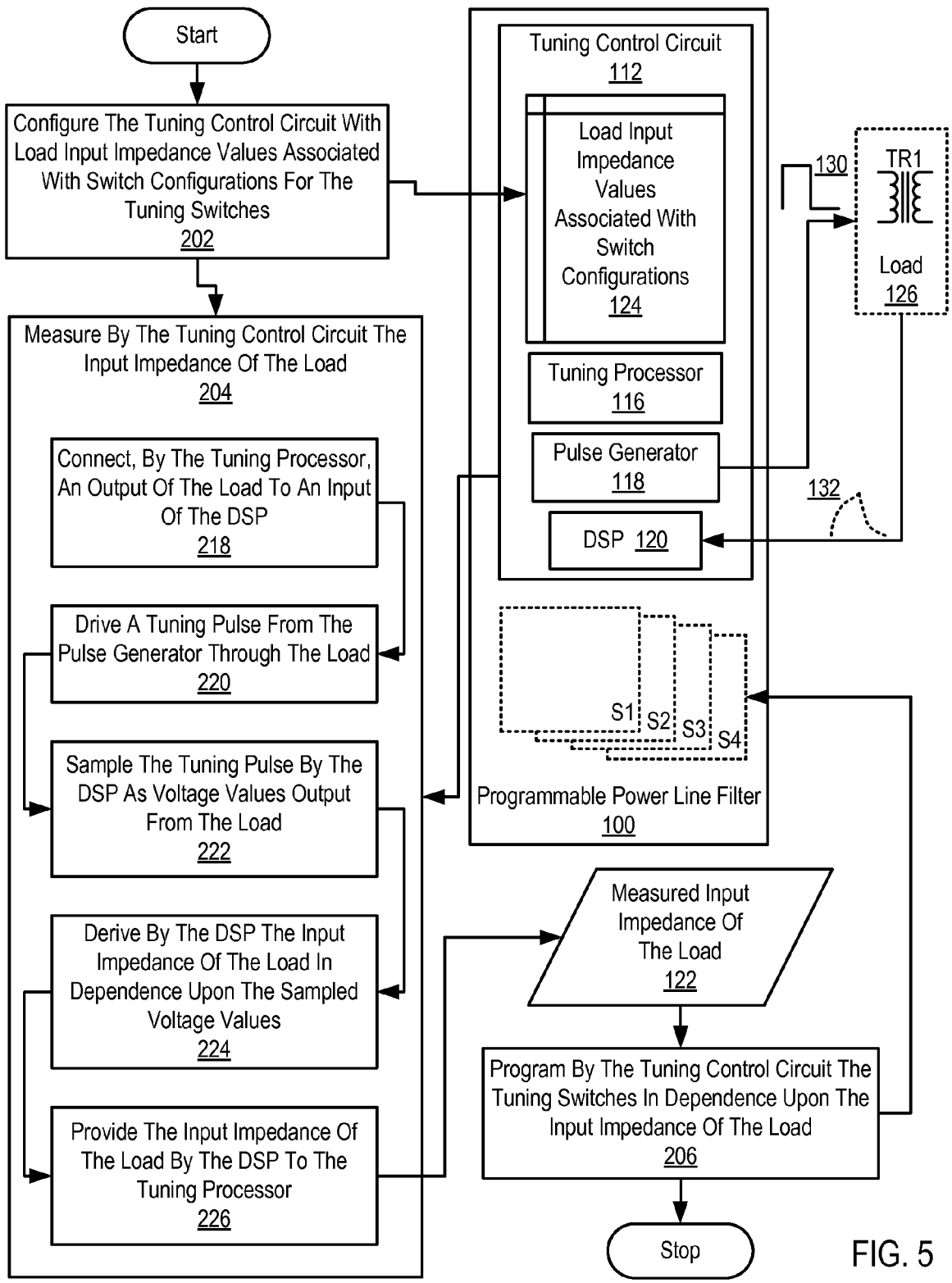

For further explanation, FIG. 5 sets forth a flow chart illustrating a further example method of tuning a programmable power line filter according to embodiments of the present invention. The method of FIG. 5 is similar to the method of FIG. 3 in that tuning a programmable power line filter according to the method of FIG. 5 is carried out with a programmable power line filter like the one illustrated and described above with regard to FIG. 1—with a live line, a neutral line, a ground line, inductors, X-capacitors, Y-capacitors, tuning switches, programming switches, and a tuning control circuit—all disposed with respect to one another as shown and described above with reference to FIG. 1. The method of FIG. 3 therefore is described here with reference both to FIG. 3 and also to FIG. 1, using reference numbers from both figures. The method of FIG. 5 is further similar to the method of FIG. 3 in that method of FIG. 5 includes configuring (202) the tuning control circuit (112) with load input impedance values associated with switch configurations for the tuning switches (124), measuring (204) by the tuning control circuit the input impedance (122) of the load (126), and programming (106) by the tuning control circuit the tuning switches (S1, S2, S3, S4) in dependence upon the input impedance (122) of the load. In the method of FIG. 5, however, the tuning control circuit (112) includes a tuning processor (116) operably coupled through a data bus (128) to a pulse generator (118) and to a DSP (120). Also in the method of FIG. 5, measuring (204) the input impedance of the load includes connecting (218), by the tuning processor, an output (136) of the load (126) to an input (138) of the DSP (120), driving (220) a tuning pulse (123, 130) from the pulse generator (118) through the load (126), sampling (222) the tuning pulse (123, 132) by the DSP (120) as voltage values output from the load (126), deriving (224) by the DSP (120) the input impedance (122) of the load in dependence upon the sampled voltage values, and providing (226) the input impedance (122) of the load by the DSP (120) to the tuning processor (116).

Figure 6:
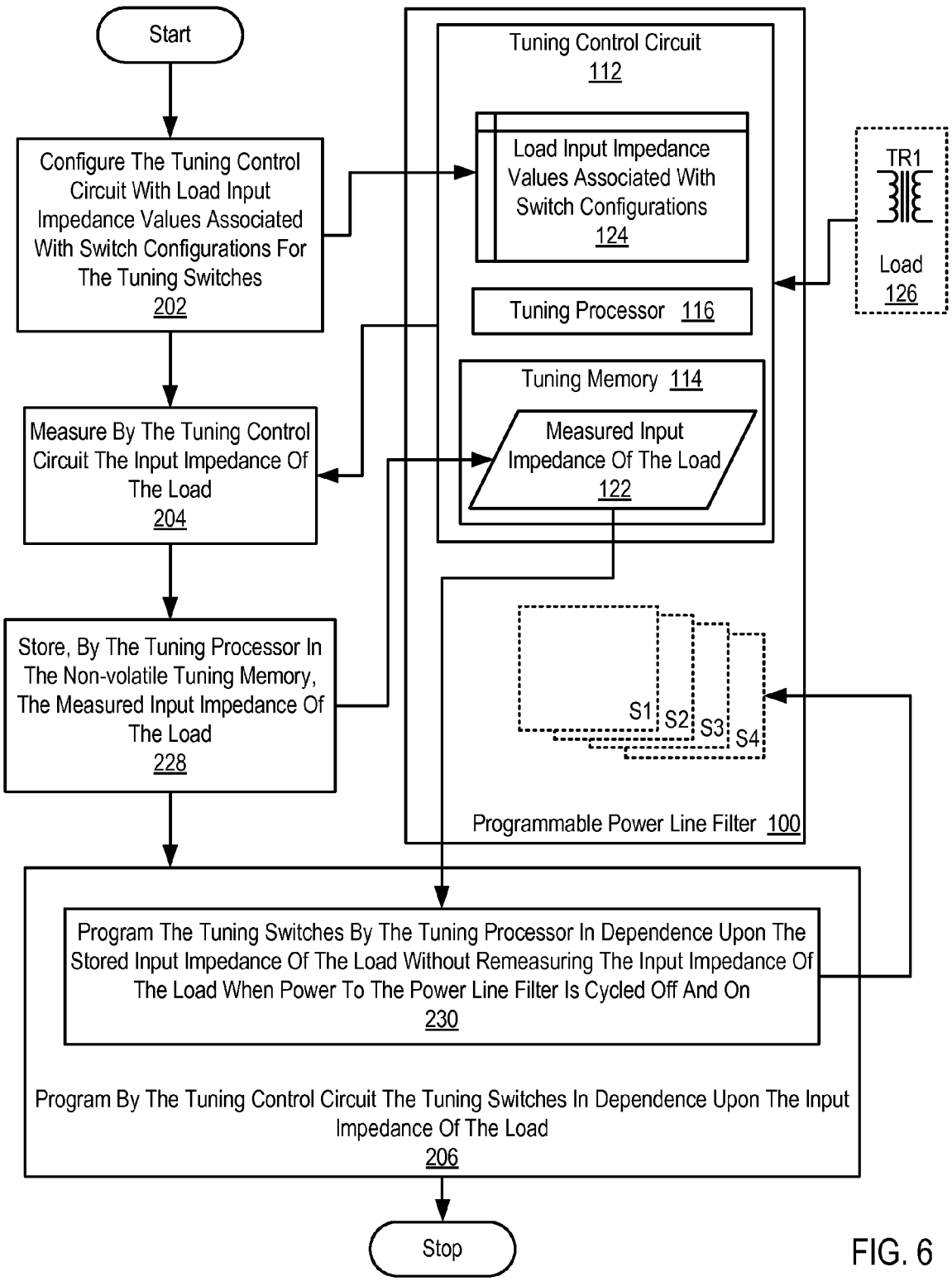

For further explanation, FIG. 6 sets forth a flow chart illustrating a further example method of tuning a programmable power line filter according to embodiments of the present invention. The method of FIG. 6 is similar to the method of FIG. 3 in that tuning a programmable power line filter according to the method of FIG. 6 is carried out with a programmable power line filter like the one illustrated and described above with regard to FIG. 1—with a live line, a neutral line, a ground line, inductors, X-capacitors, Y-capacitors, tuning switches, programming switches, and a tuning control circuit—all disposed with respect to one another as shown and described above with reference to FIG. 1. The method of FIG. 3 therefore is described here with reference both to FIG. 3 and also to FIG. 1, using reference numbers from both figures. The method of FIG. 6 is further similar to the method of FIG. 3 in that method of FIG. 6 includes configuring (202) the tuning control circuit (112) with load input impedance values associated with switch configurations for the tuning switches (124), measuring (204) by the tuning control circuit the input impedance (122) of the load (126), and programming (106) by the tuning control circuit the tuning switches (S1, S2, S3, S4) in dependence upon the input impedance (122) of the load. In the method of FIG. 6, however, the tuning control circuit (112) includes a tuning memory (114), at least some portion of which is non-volatile memory, with the tuning memory (114) coupled through a data bus (128) to the tuning processor (116). The method of FIG. 6 also includes storing (228), by the tuning processor (116) in the non-volatile tuning memory (114), the measured input impedance (122) of the load. Also in the method of FIG. 6, programming (206) the tuning switches includes programming (230) the tuning switches by the tuning processor (116) in dependence upon the stored input impedance (122) of the load without remeasuring the input impedance of the load when power to the power line filter (100) is cycled off and on.

In view of the explanations set forth above, readers will recognize that the benefits of tuning a programmable power line filter according to embodiments of the present invention include adjusting the operating characteristics, the resonant response, characteristic impedance, transfer function, pole locations, and so on, of a programmable power line filter quickly and automatically without physical substitution of circuit elements.

Example embodiments of the present invention are described largely in the context of a fully functional computer system for tuning a programmable power line filter. Readers of skill in the art will recognize, however, that the present invention also may be embodied in a computer program product disposed upon computer readable storage media for use with automated programmable power line filters. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the example embodiments described in this specification are oriented to software installed and executing on computer hardware such as a tuning processor in a power line filter, nevertheless, alternative embodiments implemented as firmware or as hardware are well within the scope of the present invention.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A method of tuning a programmable power line filter, the power line filter comprising:
   a live line, a neutral line, and a ground line connected to input terminals of the filter on an input side of the filter, the live line and the neutral line connected through inductors in the filter to output terminals on an output side of the filter;
   at least one inductor disposed in the live line between the input terminals and the output terminals, this at least one inductor characterized by an input side and an output side; at least one inductor disposed in the neutral line between the input terminals and the output terminals, this at least one inductor also characterized by an input side and an output side;
   a plurality of X-capacitors selectably connected through a first tuning switch between the live line and the neutral line on the input side of the inductors;
   a plurality of X-capacitors selectably connected through a second tuning switch between the live line and the neutral line on the output side of the inductors; a plurality of Y-capacitors selectably connected through a third tuning switch between the live line and ground on the output side of the inductors; a plurality of Y-capacitors selectably connected through a fourth tuning switch between the neutral line and ground on the output side of the inductors; and
   a tuning control circuit connected to the tuning switches and selectably connected through one or more programming switches to a load;
   the method comprising:
   measuring by the tuning control circuit an input impedance of the load; and
   programming by the tuning control circuit the tuning switches in dependence upon the input impedance of the load.

2. The method of claim 1 further comprising configuring the tuning control circuit with load input impedance values associated with switch configurations for the tuning switches.

3. The method of claim 1 further comprising:
   configuring the tuning control circuit with load input impedance values associated with switch configurations for the tuning switches;
   wherein programming the tuning switches further comprises:
   selecting a switch configuration in dependence upon the switch configuration's associated load input impedance value and the measured input impedance of the load; and
   setting the tuning switches according to the selected switch configuration.

4. The method of claim 1 wherein measuring the input impedance of the load further comprises deriving, from sampled voltage values of a tuning pulse driven from the tuning control circuit through the load, the input impedance of the load.

5. The method of claim 1 wherein measuring the input impedance of the load further comprises:
   driving by the tuning control circuit a tuning pulse through the load;
   sampling by the tuning control circuit voltage values of the tuning pulse as output from the load; and
   deriving by the tuning control circuit, in dependence upon the sampled voltage values the input impedance of the load.

6. The method of claim 1 wherein the tuning control circuit further comprises a tuning processor operably coupled through a data bus to a pulse generator and to a digital signal processor ('DSP'), and measuring the input impedance of the load further comprises:
   connecting, by the tuning processor, an output of the load to an input of the DSP;
   driving a tuning pulse from the pulse generator through the load;
   sampling the tuning pulse by the DSP as voltage values output from the load;
   deriving by the DSP the input impedance of the load in dependence upon the sampled voltage values; and
   providing the input impedance of the load by the DSP to the tuning processor.

7. The method of claim 1 wherein:
   the tuning control circuit further comprises a tuning processor operably coupled through a data bus to non-volatile tuning memory;

the method further comprises storing, by the tuning processor in the non-volatile tuning memory, the measured input impedance of the load; and programming the tuning switches further comprises programming the tuning switches by the tuning processor in dependence upon the stored input impedance of the load without remeasuring the input impedance of the load when power to the power line filter is cycled off and on.

8. A programmable power line filter comprising:
a live line, a neutral line, and a ground line connected to input terminals of the filter on an input side of the filter, the live line and the neutral line connected through inductors in the filter to output terminals on an output side of the filter;
at least one inductor disposed in the live line between the input terminals and the output terminals, this at least one inductor characterized by an input side and an output side; at least one inductor disposed in the neutral line between the input terminals and the output terminals, this at least one inductor also characterized by an input side and an output side; a plurality of X-capacitors selectably connected through a first tuning switch between the live line and the neutral line on the input side of the inductorsf; a plurality of X-capacitors selectably connected through a second tuning switch between the live line and the neutral line on the output side of the inductors; a plurality of Y-capacitors selectably connected through a third tuning switch between the live line and ground on the output side of the inductors; a plurality of Y-capacitors selectably connected through a fourth tuning switch between the neutral line and ground on the output side of the inductors; and
a tuning control circuit connected to the tuning switches and selectably connected through one or more programming switches to a load, the tuning control circuit configured to tune the filter by measuring an input impedance of the load and programming the tuning switches in dependence upon the input impedance of the load.

9. The filter of claim 8 further comprising the tuning control circuit configured with load input impedance values associated with switch configurations for the tuning switches.

10. The filter of claim 8 wherein the tuning control circuit is configured with load input impedance values associated with switch configurations for the tuning switches, and programming the tuning switches further comprises:
selecting a switch configuration in dependence upon the switch configuration's associated load input impedance value and the measured input impedance of the load; and
setting the tuning switches according to the selected switch configuration.

11. The filter of claim 8 wherein measuring the input impedance of the load further comprises deriving, from sampled voltage values of a tuning pulse driven from the tuning control circuit through the load, the input impedance of the load.

12. The filter of claim 8 wherein measuring the input impedance of the load further comprises:
driving by the tuning control circuit a tuning pulse through the load;
sampling by the tuning control circuit voltage values of the tuning pulse as output from the load; and
deriving by the tuning control circuit, in dependence upon the sampled voltage values the input impedance of the load.

13. The filter of claim 8 wherein the tuning control circuit further comprises a tuning processor operably coupled through a data bus to a pulse generator and to a digital signal processor ('DSP'), and measuring the input impedance of the load further comprises:
connecting, by the tuning processor, an output of the load to an input of the DSP;
driving a tuning pulse from the pulse generator through the load;
sampling the tuning pulse by the DSP as voltage values output from the load;
deriving by the DSP the input impedance of the load in dependence upon the sampled voltage values; and
providing the input impedance of the load by the DSP to the tuning processor.

14. The filter of claim 8 wherein:
the tuning control circuit further comprises a tuning processor operably coupled through a data bus to non-volatile tuning memory;
the tuning control circuit is further configured to tune the filter by storing, by the tuning processor in the non-volatile tuning memory, the measured input impedance of the load; and
programming the tuning switches further comprises programming the tuning switches by the tuning processor in dependence upon the stored input impedance of the load without remeasuring the input impedance of the load when power to the power line filter is cycled off and on.

15. A computer program product for tuning a programmable power line filter, the power line filter comprising:
a live line, a neutral line, and a ground line connected to input terminals of the filter on an input side of the filter, the live line and the neutral line connected through inductors in the filter to output terminals on an output side of the filter;
at least one inductor disposed in the live line between the input terminals and the output terminals, this at least one inductor characterized by an input side and an output side; at least one inductor disposed in the neutral line between the input terminals and the output terminals, this at least one inductor also characterized by an input side and an output side; a plurality of X-capacitors selectably connected through a first tuning switch between the live line and the neutral line on the input side of the inductor; a plurality of X-capacitors selectably connected through a second tuning switch between the live line and the neutral line on the output side of the inductors; a plurality of Y-capacitors selectably connected through a third tuning switch between the live line and ground on the output side of the inductors; a plurality of Y-capacitors selectably connected through a fourth tuning switch between the neutral line and ground on the output side of the inductors; and
a tuning control circuit connected to the tuning switches and selectably connected through one or more programming switches to a load;
the computer program product disposed in a computer-readable recording medium, the computer program product comprising computer program instructions capable, when executed, of causing the tuning control circuit to tune the filter by measuring an input impedance of the load and programming the tuning switches in dependence upon the input impedance of the load.

16. The computer program product of claim 15 wherein the tuning control circuit is configured with load input impedance values associated with switch configurations for the tuning switches.

17. The computer program product of claim 15 wherein the tuning control circuit is configured with load input impedance values associated with switch configurations for the tuning switches and programming the tuning switches further comprises:

selecting a switch configuration in dependence upon the switch configuration's associated load input impedance value and the measured input impedance of the load; and setting the tuning switches according to the selected switch configuration.

18. The computer program product of claim 15 wherein measuring the input impedance of the load further comprises:

driving by the tuning control circuit a tuning pulse through the load;

sampling by the tuning control circuit voltage values of the tuning pulse as output from the load; and deriving by the tuning control circuit, in dependence upon the sampled voltage values the input impedance of the load.

19. The computer program product of claim 15 wherein the tuning control circuit further comprises a tuning processor operably coupled through a data bus to a pulse generator and to a digital signal processor ('DSP'), and measuring the input impedance of the load further comprises:

connecting, by the tuning processor, an output of the load to an input of the DSP;

driving a tuning pulse from the pulse generator through the load;

sampling the tuning pulse by the DSP as voltage values output from the load;

deriving by the DSP the input impedance of the load in dependence upon the sampled voltage values; and providing the input impedance of the load by the DSP to the tuning processor.

20. The computer program product of claim 15 wherein:

the tuning control circuit further comprises a tuning processor operably coupled through a data bus to non-volatile tuning memory;

the computer program product further comprises computer program instructions capable, when executed, of causing the tuning control circuit to tune the filter by storing, by the tuning processor in the non-volatile tuning memory, the measured input impedance of the load; and programming the tuning switches further comprises programming the tuning switches by the tuning processor in dependence upon the stored input impedance of the load without remeasuring the input impedance of the load when power to the power line filter is cycled off and on.

* * * * *